(12) United States Patent
Hetzler et al.

(10) Patent No.: US 9,442,393 B2
(45) Date of Patent: Sep. 13, 2016

(54) PROJECTION EXPOSURE TOOL FOR MICROLITHOGRAPHY AND METHOD FOR MICROLITHOGRAPHIC IMAGING

(71) Applicant: Carl Zeiss SMT GmbH, Oberkochen (DE)

(72) Inventors: Jochen Hetzler, Aalen (DE); Aksel Goehnermeier, Essingen-Lauterburg (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/524,486

(22) Filed: Oct. 27, 2014

(65) Prior Publication Data

US 2015/0042975 A1 Feb. 12, 2015

Related U.S. Application Data

(63) Continuation of application No. 13/785,707, filed on Mar. 5, 2013, now Pat. No. 9,046,792, which is a continuation of application No. PCT/EP2011/004741, filed on Sep. 22, 2011.

(60) Provisional application No. 61/387,250, filed on Sep. 28, 2010.

(30) Foreign Application Priority Data

Sep. 28, 2010 (DE) .................. 10 2010 041 556

(51) Int. Cl.
| | | |
|---|---|---|
| *G03F 9/00* | (2006.01) | |
| *G01B 11/00* | (2006.01) | |
| *G03F 7/20* | (2006.01) | |
| *G01B 9/02* | (2006.01) | |
| *G01B 11/14* | (2006.01) | |

(52) U.S. Cl.
CPC ....... *G03F 7/70675* (2013.01); *G01B 9/02015* (2013.01); *G01B 11/14* (2013.01); *G03F 7/7085* (2013.01); *G03F 7/70616* (2013.01); *G03F 7/70733* (2013.01); *G03F 9/7003* (2013.01); *G03F 9/7049* (2013.01); *G01B 2290/65* (2013.01)

(58) Field of Classification Search
CPC .......... G03F 7/70675; G03F 7/70616; G03F 7/70733; G03F 7/7085; G03F 9/7003; G03F 9/7049; G01B 9/02015; G01B 11/14; G01B 2290/65
USPC ....... 430/22, 30; 355/53; 356/399, 400, 401, 356/499
See application file for complete search history.

(56) References Cited

U.S. PATENT DOCUMENTS

| | | | |
|---|---|---|---|
| 4,676,645 | A | 6/1987 | Taniguchi et al. |
| 5,202,748 | A | 4/1993 | MacDonald et al. |
| 5,227,862 | A | 7/1993 | Oshida et al. |
| 5,333,050 | A | 7/1994 | Nose et al. |
| 5,648,658 | A | 7/1997 | Holzapfel et al. |
| 5,654,798 | A | 8/1997 | Bruning |
| 5,834,767 | A | 11/1998 | Hasegawa et al. |
| 5,991,461 | A | 11/1999 | Schmucker |
| 6,249,351 | B1 | 6/2001 | de Groot |
| 6,624,893 | B1 | 9/2003 | Schmit |
| 6,897,940 | B2 | 5/2005 | Sogard |
| 6,934,005 | B2 | 8/2005 | Roux et al. |
| 7,538,856 | B2 | 5/2009 | Kajiyama et al. |
| 7,593,100 | B2 | 9/2009 | Okita |
| 7,630,058 | B2 | 12/2009 | Kawashima et al. |
| 7,675,629 | B2 | 3/2010 | Ohsaki et al. |
| 8,243,281 | B2 | 8/2012 | Doerband |
| 9,046,792 | B2 | 6/2015 | Hetzler et al. |
| 2002/0001088 | A1 | 1/2002 | Wegmann et al. |
| 2002/0081498 | A1 | 6/2002 | Ehrmann |
| 2002/0167651 | A1 | 11/2002 | Boonman et al. |
| 2003/0016338 | A1 | 1/2003 | Yasuda et al. |
| 2003/0090640 | A1 | 5/2003 | Fujisawa et al. |
| 2003/0193655 | A1 | 10/2003 | Ina |
| 2004/0130691 | A1 | 7/2004 | Boonman et al. |
| 2005/0031975 | A1 | 2/2005 | Reuhman-Huisken et al. |
| 2005/0068540 | A1 | 3/2005 | De Groot et al. |
| 2005/0122506 | A1 | 6/2005 | Wegmann et al. |
| 2005/0179880 | A1 | 8/2005 | Butler et al. |
| 2006/0033934 | A1 | 2/2006 | Evans |
| 2006/0158659 | A1 | 7/2006 | Colonna de Lega et al. |
| 2006/0227334 | A1 | 10/2006 | Kakuchi |
| 2006/0250597 | A1 | 11/2006 | Nakajima |
| 2006/0273267 | A1 | 12/2006 | Maeda |
| 2007/0019176 | A1 | 1/2007 | Akamatsu |
| 2007/0080281 | A1 | 4/2007 | Smith et al. |
| 2007/0247640 | A1 | 10/2007 | Magome et al. |
| 2008/0036982 | A1 | 2/2008 | Wegmann et al. |
| 2008/0062432 | A1 | 3/2008 | Sandig et al. |

(Continued)

FOREIGN PATENT DOCUMENTS

| | | |
|---|---|---|
| CN | 1550910 A | 12/2004 |
| CN | 101458458 A | 6/2009 |

(Continued)

OTHER PUBLICATIONS

Chinese Office Action and Search Report, with translation thereof, for CN Appl No. 201180046883.4, dated Oct. 30, 2014.

(Continued)

*Primary Examiner* — Christopher Young

(74) *Attorney, Agent, or Firm* — Fish & Richardson P.C.

(57) ABSTRACT

A projection exposure tool for microlithography for imaging mask structures of an image-providing substrate onto a substrate to be structured includes a measuring apparatus configured to determine a relative position of measurement structures disposed on a surface of one of the substrates in relation to one another in at least one lateral direction with respect to the substrate surface and to thereby simultaneously measure a number of measurement structures disposed laterally offset in relation to one another.

20 Claims, 8 Drawing Sheets

(56) References Cited

U.S. PATENT DOCUMENTS

| | | | |
|---|---|---|---|
| 2008/0128642 A1 | 6/2008 | Mos et al. |
| 2009/0097008 A1 | 4/2009 | Mos et al. |
| 2009/0116036 A1 | 5/2009 | Wegmann |
| 2009/0262323 A1 | 10/2009 | Sasaki |
| 2009/0262362 A1 | 10/2009 | de Groot et al. |
| 2010/0002950 A1 | 1/2010 | Arieli et al. |
| 2010/0129741 A1 | 5/2010 | Bijvoet |
| 2010/0209832 A1 | 8/2010 | Matsuda |
| 2010/0231890 A1 | 9/2010 | Oudshoorn et al. |
| 2011/0085179 A1 | 4/2011 | Mann et al. |
| 2012/0176625 A1 | 7/2012 | Huntley et al. |
| 2013/0182264 A1 | 7/2013 | Hetzler et al. |
| 2013/0252146 A1 | 9/2013 | Hetzler et al. |

FOREIGN PATENT DOCUMENTS

| | | |
|---|---|---|
| EP | 1 037 117 | 9/2000 |
| EP | 1349011 | 10/2003 |
| EP | 1 452 851 | 9/2004 |
| JP | 2003-524175 | 8/2003 |
| JP | 2003-282420 | 10/2003 |
| JP | 2005-519299 | 6/2005 |
| JP | 2006-339600 | 12/2006 |
| JP | 2007-518257 | 7/2007 |
| JP | 2007-533128 | 11/2007 |
| JP | 2008-147654 | 6/2008 |
| JP | 2010-101898 | 5/2010 |
| JP | 2012-533746 | 12/2012 |
| TW | 200305928 | 11/2003 |
| TW | I266148 B | 11/2006 |
| WO | WO 2008/031576 | 3/2008 |
| WO | WO 2009/121541 | 10/2009 |

OTHER PUBLICATIONS

Japanese Office Action, with translation thereof, for JP Appl No. 2013-530607, dated Feb. 2, 2015.

International Search Report and Written Opinion issued in PCT/EP2011/004741, mailed Jul. 5, 2012.

Griesmann et al., "Optical Flatness Metrology for 300 mm Silicon Wafers," AIP Conference Proceedings, vol. 788, pp. 599-603, (2005).

Gross, H., Handbook of Optical Systems: vol. 2, Physical Image Formation, Wiley-VCH Verlag GmbH & Co. KGaA Weinheim, p. 215, (2005).

Hariharan, P., "Improved Oblique-Incidence Interferometer," Optical Engineering, vol. 14, No. 3, pp. 257-258, May-Jun. 1975.

Hariharan, P., "White-Light Interference Microscopy," Basics of Interferometry, Academic Press (second edition), Chapter 12, pp. 105-110, (2007).

Mantravadi, "Newton, Fizeau, and Haidinger Interferometers," Optical Shop Testing, Wiley & Sons Second Edition, edited by Daniel Malacara, Chapter 1, pp. 1-45, (1992).

Office Action issued on Jul. 18, 2011 by the German Patent and Trademark Office in application No. DE 10 2010 041 556.1, includes English translation, 12 pages.

Raymond, "High-speed noninterferometric nanotopographic characterization of Si wafer surfaces," Proceedings of SPIE, vol. 4809, pp. 208-216, Jan. 1, 2002.

Schwider et al., "Semiconductor wafer and technical flat planeness testing interferometer," Applied Optics, vol. 25, No. 7, pp. 1117-1121, Apr. 1, 1986.

Sivakumar et al., "Larg surface profile measurement with instantaneous phase-shifting interferometry," Opt. Eng. vol. 42, No. 2, pp. 367-372, Feb. 2003.

Valley et al., "Interferometric metrology of wafer nanotopography for advanced CMOS process integration," Proceedings of SPIE, vol. 4449, pp. 160-168, (2001).

Japanese Office Action, with translation thereof, for corresponding JP Appl No. 2013-530607, dated Mar. 10, 2014.

Taiwanese Office Action, with translation thereof, for corresponding TW Appl No. 100134773, dated Mar. 9, 2016.

(a)　　　　　　　　　(b)

PROJECTION EXPOSURE TOOL FOR MICROLITHOGRAPHY AND METHOD FOR MICROLITHOGRAPHIC IMAGING

CROSS-REFERENCE TO RELATED APPLICATIONS

This application is a continuation of, and claims priority under 35 USC 120 to, U.S. application Ser. No. 13/785,707, filed Mar. 5, 2013, which is a continuation of, and claims priority under 35 USC 120 to, International Patent Application Serial Number PCT/EP2011/004741, filed Sep. 22, 2011, which claims benefit under 35 USC 119 of German Patent Application No. 10 2010 041 556.1, filed Sep. 28, 2010. International Patent Application Serial Number PCT/EP2011/004741, filed Sep. 22, 2011, also claims priority under 35 USC 119(e) to U.S. Patent Application Ser. No. 61/387,250, filed Sep. 28, 2010. The entire contents of each of these applications are incorporated herein by reference.

FIELD

The disclosure relates to a projection exposure tool for microlithography for imaging an image-providing substrate in the form of a reticle onto a substrate to be structured, in particular a wafer. The disclosure further relates to a method for the microlithographic imaging of mask structures of an image-providing substrate onto a substrate to be structured.

When producing microchips, a semiconductor wafer is usually lithographically exposed in a number of consecutive exposure steps in order to image desired structures. After each exposure step, procedural processing steps are performed to structure the wafer according to the imaged structures, for example via etching processes and material depositions. In every exposure step, it is ensured that the exposure is adjusted with respect to previous exposures in the lateral direction. In other words, one should be able to produce structures generated by the exposure that are laterally precisely over the previously exposed structures, optionally taking into account position deviations provided in the design. The lateral adjustment of the individual exposure levels is generally called "overlay".

The lateral adjustment reference structures or adjustment marks, also referred to as alignment marks, printed in earlier exposure steps are generally measured on the wafer and the wafer table with respect to the lateral position of the latter. For this purpose the adjustment marks are approached and measured one after the other by measuring optics. So as not to limit the wafer throughput by the measurement, in many modern lithography tools the measurement is taken on a measuring table which is disposed adjacent to the exposure table. An already measured wafer is exposed on the exposure table parallel to the measurement of a wafer. The measuring time is then restricted to the time to expose a wafer so as not to have to accept any losses in the wafer throughput. The measuring times can only be achieved by high speeds and accelerations of the measuring table. This in turn leads to the undesired transfer of vibrations of the measuring table onto the exposure table, and this results in position errors of the lithographic image with respect to the desired position. In lithography exposure tools with just one wafer table the measuring time affects the wafer throughput linearly, and this is why in this case correspondingly high technical complexity is used in order to achieve high accelerations and speeds of the wafer table when measuring the wafer.

Moreover, generally, adjustment marks on the reticle to be exposed are measured in the projection exposure tool with respect to their lateral position. This is performed in the same way as for the wafer measurement via a scanning process via sampling of the adjustment marks, one after the other.

SUMMARY

The disclosure provides an apparatus and a method with which a lateral position measurement on the wafer or the reticle can be measured with a justifiable degree of complexity in a shorter time.

In one aspect, the disclosure provides a projection exposure tool for microlithography for imaging mask structures of an image-providing structure onto a substrate to be structured. The projection exposure tool includes a measuring apparatus which is configured to determine a relative position of measurement structures disposed on a surface of one of the substrates in relation to one another in at least one lateral direction with respect to the substrate surface, and to thereby simultaneously measure a number of measurement structures laterally offset in relation to one another. A lateral direction with respect to the substrate surface in this context is characterized by a vector parallel to the substrate surface.

In other words, the measuring apparatus is configured to either measure the image-providing substrate in the form of a reticle, or to measure the substrate to be structured, e.g., in the form of a wafer or of a substrate for an LCD display, with respect to the lateral relative position of measurement structures disposed on the substrate. This measurement is taken in parallel, i.e., a number of measurement structures are measured simultaneously. The measuring apparatus is thus configured to measure measurement structures distributed over at least one two-dimensional section of the substrate surface simultaneously.

According to an embodiment, deviations of the lateral positions of the measurement structures from their desired positions are thereby measured. According to one variant according to the disclosure, two of the simultaneously measured measurement structures are at least 1 mm, in particular at least 10 mm, at least 50 mm, or at least 100 mm, apart from one another, and in particular are offset over the entire substrate surface in both lateral coordinate directions. By comparing the lateral relative position of the measurement structures in relation to one another determined according to the disclosure with desired values a distortion of an image of a previous exposure level including the measurement structures can be determined on a wafer.

Using the simultaneous measurement of a number of measurement structures in relation to one another on the wafer surface, the measuring time for determining the measuring data for the lateral adjustment of a pending wafer exposure with respect to structures already located on the wafer is reduced. The desired properties for speeds and acceleration of a measuring table used for the measurement are thus reduced, by which possible vibration transfers onto the exposure table can be avoided. Furthermore, the simultaneous measurement enables more closely meshed measurement of the wafer in the existing time window, by which the quality of the overlay between individual exposure levels can be increased.

According to an embodiment, the measuring apparatus is configured to simultaneously measure the lateral relative position of measurement structures distributed over the whole substrate surface. The whole substrate surface is understood to mean the surface of the side of the substrate facing towards the measuring apparatus. In other words, the measuring apparatus includes a detection region covering the whole substrate surface for measuring the lateral relative position. According to an alternative embodiment, the measuring apparatus is configured to measure the substrate surface at least section by section, and has an evaluating device which is configured to combine the measurements of the individual substrate sections. Due to the measurement section by section the installation space for the measuring apparatus and the complexity of the measuring apparatus itself can be reduced.

According to an embodiment, the measurement structures are disposed in the same structural level of the substrate subject of measurement. For example, such a structural level may have a thickness, i.e. an expansion in the height direction of the substrate, of less than 100 nm, in particular less than 50 nm or less than 10 nm. According to a variant, the substrate to be structured, e.g., a wafer, is subject to measurement and the measurement structures are disposed in the same exposure level of this substrate. In other words, the measurement structures measured using the measuring apparatus regarding their relative positions have been printed during the same previous exposure of the substrate. They are therefore arranged in the same structural level of the substrate. This is in contrast to measurement structures used for performing an overlay measurement, which structures are arranged in different exposure levels.

In an embodiment, the measuring apparatus is configured to simultaneously measure the respective lateral relative position of at least three measurement structures, in particular at least four, at least five or at least six measurement structures.

According to a further embodiment, the measuring apparatus is configured to take the lateral position measurement on the substrate to be structured and thus, e.g. on a semiconductor wafer or a substrate for an LCD display.

According to a further embodiment, the measuring apparatus for the lateral position measurement of the measurement structures is configured as an interferometric measuring apparatus. In other words, the measuring apparatus is configured to superimpose two light beams interferometrically for the lateral position measurement of the measurement structures, and to determine the desired measurements from the resulting interferogram.

According to a further embodiment, the measuring apparatus includes at least two reflective elements which serve to reflect back onto the measurement structures measuring light divided into two measuring beams by diffraction on the measurement structures. The two measuring beams can in particular be formed by measuring light diffracted into positive and negative diffraction order. According to one embodiment, the measuring apparatus includes four reflection elements, specifically two reflection elements respectively for each lateral measuring direction. Mirrors or cats' eyes reflectors can be used as reflection elements. The reflection elements are preferably placed on opposite sides of the substrate disposed in the measuring position, and according to one embodiment have dimensions of at least 300 mm×at least 50 mm.

According to an embodiment, the measuring apparatus includes a beam splitter for splitting measuring light into two measuring beams with different propagation directions before striking the substrate to be measured. According to an embodiment, the beam splitter includes a diffraction grating. The diffraction grating can be in the form of a 2-dimensional grating, e.g., with chessboard-type patterns. According to another variant, the diffraction grating is composed of individual grating segments in the form of 1-dimensional line gratings, the line gratings being provided in two orientations turned about 90° in relation to one another, and the grating segments with different orientation being arranged alternately in the form of a chessboard pattern.

According to a further embodiment, the measuring apparatus includes a measuring light source for generating the measuring light for the lateral position measurement, and the wavelength of the measuring light is smaller than the grating period of the beam splitter. It is thus ensured that with the interaction of the measuring light with the grating of the beam splitter light portions are directed in diffraction orders differing from the zero diffraction order. According to one embodiment the beam splitter includes gratings matched to grating structures on the substrate.

According to a further embodiment, the measuring apparatus is configured to irradiate the measuring light at an oblique angle to the substrate surface to be measured onto the beam splitter, or for an embodiment in which there is no beam splitter, onto the substrate surface. In other words, the propagation direction of the measuring light deviates from the surface normal. The deviation is in particular at least 0.1°, preferably at least 0.5°.

According to a further embodiment, the measuring apparatus is configured to direct both of the measuring beams of the measuring light at different angles onto the substrate disposed in a measuring position.

According to a further embodiment, the measuring apparatus is configured to superimpose coherently images of the measurement structures generated by the two measuring beams. The superimposition produces an interferogram that is evaluated in order to determine the lateral relative positions of the measurement structures.

According to a further embodiment, the measuring apparatus is configured to determine distortion over the substrate surface from the lateral position measurements, and the projection exposure tool further includes an exposure control apparatus which is configured to adapt the local imaging scale dynamically to the distortion when exposing the substrate. In other words, the measurement according to the disclosure enables dynamic adaptation of a scale manipulator when exposing a substrate. The distortion is understood here to be in particular a field to field variation of the scale of structures written in an earlier optical imaging process onto the substrate surface.

According to a further embodiment, the measuring apparatus is further configured to take topography measurements at a number of points of the substrate surface simultaneously. In other words, a form measurement and a measurement of height variations are performed in parallel at a number of locations of the substrate surface. Preferably, the measuring apparatus is configured to take the topography measurement with accuracy of better than 10 nm.

According to a further embodiment, the measuring apparatus is configured to take the measurements of the lateral relative position of the measurement structures and the topography measurements simultaneously.

According to a further embodiment, the measuring apparatus is configured to take the lateral position measurements with measuring light of a first wavelength and the topography measurements with measuring light of a second wavelength. The first wavelength differs from the second wavelength such that a separate detection of interferograms generated by the light of the individual wavelengths is possible. Preferably the measuring wavelengths differ by at least 100 nm. For example, a laser wavelength such as 1064 nm together with the frequency-doubled wavelength of 532 nm can be used as wavelengths. According to a further embodiment, the measuring light for the topography measurements differs from the measuring light for the lateral position measurements in the polarisation.

According to a further embodiment, the measuring apparatus includes a diffraction grating serving as a beam splitter for splitting the measuring light of the first wavelength into two measuring beams, the diffraction grating being configured such that at least 90% of the measuring light of the second wavelength passes through the diffraction grating without being diffracted. Thus, the generation of interfering light by diffraction of the measuring light used for the topography measurement into a diffraction order differing from the zero diffraction order is avoided. This can be achieved either by the second wavelength being chosen to be larger than the period of the diffraction grating, or by a specially adapted grating profile for suppressing higher diffraction orders being used.

According to a further embodiment, the diffraction grating is tilted in relation to the propagation direction of the measuring light of the second wavelength. It is thus ensured that back reflexes generated on the beam splitter by the measuring light of the second wavelength do not have a negative impact upon the measurement. Furthermore, in particular the propagation direction of the measuring light used for the topography measurement is tilted in relation to the surface normal of the substrate to be measured. Moreover, it is advantageous if the diffraction grating is tilted in relation to the surface of the substrate to be measured. All of these measures prevent interfering reflexes reaching a detector used for the measurements. Furthermore, the rear side of the diffraction grating can be provided with a coating in order to further weaken interfering reflexes.

According to a further embodiment, the measuring apparatus is configured to take the measurement of the whole substrate surface in less than 10 seconds. Here, according to the disclosure, the measuring apparatus can be configured to determine the lateral relative position of the measurement structures in relation to one another with an accuracy of better than 1 nm.

Furthermore, according to a further aspect, the aforementioned object can be achieved, for example with a method for the microlithographic imaging of mask structures of an image-providing substrate onto a substrate to be structured. According to this method, a relative position of measurement structures disposed on a surface of one of the substrates in relation to one another is determined in at least one lateral direction with respect to the substrate surface by simultaneously measuring a number of measurement structures offset laterally in relation to one another. Furthermore, the mask structures are imaged onto the substrate to be structured via a projection exposure tool for microlithography, during the exposure an imaging parameter being varied locally upon the basis of the lateral position measurements. Such a local variation of an imaging parameter may, e.g., be a field to field variation of the imaging scale regarding the imaging of the mask structures onto the substrate to be structured.

According to a further embodiment of the method, the imaging scale is varied locally during the exposure of the substrate. This is executed upon the basis of the lateral position measurements. According to one variant according to the disclosure the measurement structures disposed on the substrate include diffraction gratings of different periodicities. The latter are preferably configured for the reflection into themselves of the aforementioned measuring beams, which are generated by a beam splitter. According to an embodiment the grating sections of different periodicity can respectively be disposed in two grating orientations being orthogonal to one another.

According to a further embodiment, the substrate to be structured is measured, and the entirety of the measurement structures forms a web structure with a plurality of web meshes which surround product areas which can respectively be structured by imaging of the image-providing substrate. These product areas are also often called "dies".

Furthermore, according to a further aspect, a method is provided for measuring a substrate wherein a relative position of measurement structures disposed on a surface of the substrate is determined in relation to one another in at least one lateral direction with respect to the substrate surface by simultaneous interferometric measurement of a number of measuring structures arranged laterally offset in relation to one another.

According to an embodiment of the method according to any of the above mentioned aspects of the disclosure, two of the simultaneously measured structures are at least 1 mm, in particular at least 10 mm, at least 50 mm or at least 100 mm, apart from one another. According to a further embodiment, the respective lateral relative position of at least three measurement structures, in particular at least four, at least five or at least six measurement structures are simultaneously measured.

According to a further embodiment of the method according to any of the above mentioned aspects, the measurement structures are disposed in the same structural level of the substrate subject of measurement.

The features specified with regard to the embodiments of the projection exposure tool according to the disclosure mentioned above can be applied correspondingly to the method according to the disclosure in the embodiments mentioned. Conversely, the features specified with regard to the embodiments mentioned above of the method according to the disclosure can be applied correspondingly to the projection exposure tool according to the disclosure.

BRIEF DESCRIPTION OF THE DRAWINGS

The above and further advantageous features of the disclosure are illustrated in the following detailed description of exemplary embodiments according to the disclosure with reference to the attached diagrammatic drawings, in which.

DETAILED DESCRIPTION OF EXEMPLARY EMBODIMENTS ACCORDING TO THE DISCLOSURE

In the exemplary embodiments described below elements which are similar to one another functionally or structurally are provided as far as possible with the same or similar reference numbers. Therefore, in order to understand the features of the individual elements of a specific exemplary embodiment one should refer to the description of other exemplary embodiments or the general description of the disclosure.

Figure 1:
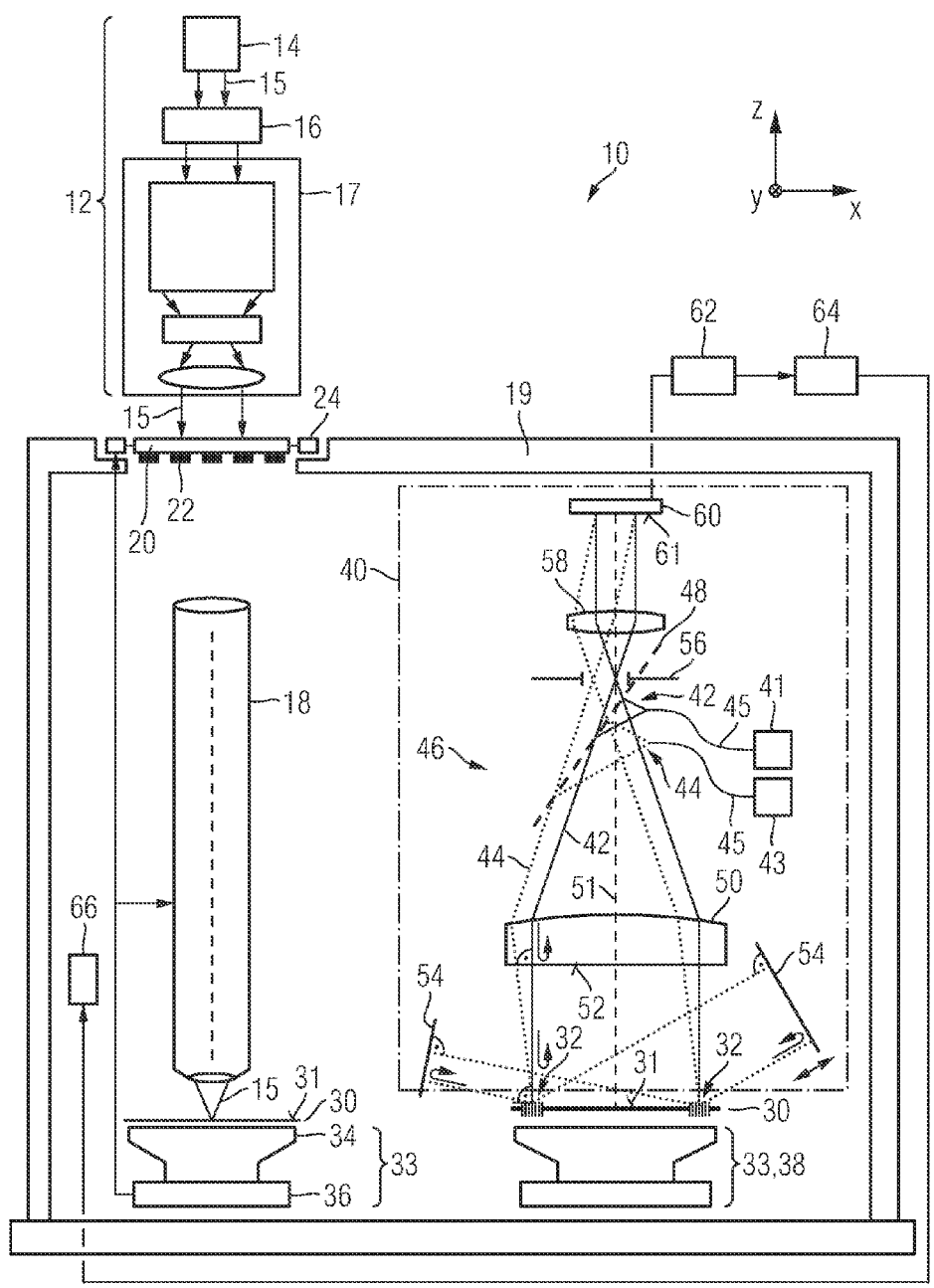
FIG. 1 an illustration of a projection exposure tool for microlithography in a sectional view with an embodiment according to the disclosure of a measuring apparatus for determining a distortion of a surface of a wafer and of the topography of the same.

In order to facilitate the description of the projection exposure tool, in the drawings a Cartesian xyz coordinate system is specified from which the respective relative position of the components shown in the figures can be gathered. In FIG. 1 the x direction extends to the right, the y direction extends perpendicularly to the plane of the drawing into the latter, and the z direction upwards.

In FIG. 1 a projection exposure tool for microlithography in an embodiment according to the disclosure is illustrated. The projection exposure tool 10 includes an illumination system 12 for illuminating an image-providing substrate in the form of a mask 20 with exposure radiation 15 and a projection objective 18. The projection objective 18 serves to image mask structures 22 from a mask plane onto a substrate to be structured in the form of a wafer 30. In addition to a silicon wafer, a substrate for an LCD display, a transparent so-called "flat panel" can also be used, for example, as the substrate to be structured.

The illumination system 12 includes an exposure radiation source 14 for generating the exposure radiation 15. Depending on the embodiment of the projection exposure tool 10, the wavelength of the exposure radiation 15 can be in the UV wavelength range, e.g. 248 nm or 193 nm, or also in the extreme ultraviolet wavelength range (EUV), e.g. approximately 13.5 nm or approximately 6.8 nm. Depending on the exposure wavelength the optical elements of the illumination system 12 and of the projection objective 18 are designed as lenses and/or mirrors.

The exposure radiation 15 generated by the exposure radiation source 14 passes through beam propagation optics 16 and is then irradiated by an illuminator 17 onto the mask 20. The mask 20 is held by a mask table 24 which is mounted shiftably in relation to a frame 19 of the projection exposure tool 10. The wafer 30 is disposed on an exposure table 33 which serves as a wafer shifting apparatus.

The exposure table 33 includes a wafer holder 34 for fixing the wafer 30 from its lower side, for example via negative pressure, and a shifting stage 36 by which the wafer 30 can be shifted laterally to the optical axis of the projection objective 18, i.e. in the x and y directions according to the coordinate system from FIG. 1. Furthermore, the shifting stage 36 enables shifting of the wafer 30 in the direction of the optical axis, and so in the z direction according to the coordinate system from FIG. 1. This type of shift in the z direction is used in particular, when exposing the wafer 30, to hold the surface 31 of the latter in the focus of the exposure radiation 15.

Generally the surface 31 of the wafer 30 is exposed section by section, i.e. field by field. Both the wafer 30 and the mask 20 are thereby moved in opposite directions along the x axis so that a slot-shaped exposure region over the wafer surface 31 is scanned. This takes place a number of times so that the mask 20 is imaged in the form of a plurality of fields, next to one another, on the wafer surface 31.

There is integrated into the projection exposure tool 10 a measuring apparatus 40 which is configured on the one hand to measure the whole surface of the wafer 30 with respect to its distortion, and on the other hand with respect to topography variations. The distortion of the wafer 30 is understood to mean a deviation of relative positions of measurement structures arranged on the wafer surface 31 in relation to one another in the lateral direction with respect to the wafer surface 31, i.e. in the X-Y plane. In FIG. 1 the measurement structures are provided with reference number 32 and have been applied to the wafer 30 in a previous wafer processing step. The measurement structures 32 are in the form of grating structures, as will be described in more detail below.

In an embodiment of the projection exposure tool 10 the wafer 30 is disposed on the exposure table 33 beneath the measuring apparatus 40 for measuring. For this purpose the exposure table 33 is shifted into the position shown in FIG. 1 lateral to the optical axis of the projection objective 18. In an alternative embodiment the projection exposure tool 10 includes a separate measuring table 38 on which the wafer 30 is arranged during the measurement by the measuring apparatus 40, while an already measured wafer 30 is simultaneously located on the exposure table 33 and is exposed in parallel.

The measuring apparatus 40 is designed as a two-dimensionally measuring optical measuring apparatus, i.e. during the measurement both of the distortion and the surface topography of the wafer 30 corresponding measurements are simultaneously determined at a number of locations of the surface 31 in contrast to point by point sampling of the wafer surface 31.

The measuring apparatus 40 includes two measuring light sources 41 and 43 for generating measuring light of different wavelengths. A first measuring light source 41 generates a first measuring light 42 with a wavelength $\lambda_2$ which is used for the surface topography measurement, also referred to in the following as the form measurement. The second measuring light source 43 generates a second measuring light 44 with a wavelength $\lambda_1$ which is used to measure the lateral positioning of the measurement structures and so for the distortion measurement. The positioning of the measurement structures may also be referred to as "placement" of the measurement structures. The measuring light of both measuring light sources 41 and 43 is irradiated via a respective optical fibre 45 onto a beam splitter 48. Wavelengths in the visible or near infrared range can be used for the measuring light 42, as is explained in more detail below. Thus, helium neon lasers, laser diodes, solid state lasers and LEDs, for example, can be used as measuring light sources.

For the measuring light wavelengths should be chosen with respect to which the photoresist, provided for the exposure with the exposure radiation 15 on the wafer 30, is not sensitive. Preferably, the measuring wavelengths should be below the exposure threshold of the photoresist. According to one embodiment the measuring wavelength is chosen such that the energy of the photons thus generated is below the band gap of silicon. Thus, wafer heating during the measurement can be minimised. The measuring light 42 for the form measurement is deflected by the beam splitter 48 in the direction of the wafer surface 31. Before striking the wafer surface 31 the measuring light passes through a Fizeau collimator 50.

The Fizeau collimator 50 includes a Fizeau surface 52 on which part of the measuring light 42 is reflected back as reference light, whereas the unreflected part of the measuring light 42 is reflected on the wafer surface 31 and then interferes with the reference light after passing through a collimator lens 58 in the form of an ocular on a detection surface 61 of a locally resolving detector 60 in the form of a CCD camera. According to one embodiment the Fizeau collimator 50 is designed as a collimator open high up with a focal width to diameter ratio f/d<1 by which installation space in the projection exposure tool 10 can be saved.

The interferogram on the detector surface 61 is detected by the detector 60. From the interferogram detected, by an evaluating device 62 the surface profile of the section of the wafer surface 21 irradiated by the measuring light is determined. In other words, the surface topography of the wafer 30 is determined at least section by section. According to one embodiment the detection region of the measuring apparatus 40 is large enough in order to measure the whole wafer surface 31 simultaneously with respect to a surface topography.

The measuring light 44 for the positioning measurement is also deflected by the beam splitter 48 in the direction of the wafer surface 31. The propagation direction of the measuring light 44 is thereby tilted slightly in relation to the propagation direction of the measuring light 42. In the present exemplary embodiment the measuring light 42 is propagated along the optical axis 51 of the Fizeau collimator, while the propagation direction of the measuring light 44 is tilted in relation to the optical axis 51 such that upon passing through the Fizeau collimator 50, back reflexes of the measuring light 44 generated on the Fizeau surface 52 are blocked out on an aperture 56 disposed in front of the collimator lens 58 so that the back reflexes can not interfere with the positioning measurement, and when the form measurement is taken simultaneously, can not interfere with the form measurement either.

After passing through the Fizeau collimator 50 the measuring light 44 strikes the wafer surface 31 and is reflected by the measurement structures 32 disposed here in the form of grating structures in minus first or plus first diffraction order onto plane mirrors 54 disposed at an angle above the wafer 30. This beam profile is shown clearly in FIG. 2. Generally speaking, the measuring radiation 44 is reflected on the measurement structure 32 in two diffraction orders different from zero, in the present case the minus first diffraction order and the plus first diffraction order.

The light of the minus first diffraction order forms a first measuring beam 44a, and the light of the plus first diffraction order forms a second measuring beam 44b. After reflection on the plane mirror 54, the light of the first measuring beam 44a runs back to the measuring structure 32. Here the light of the first measuring beam 44a reflected in minus first diffraction order on the measurement structure 32 passes back to the beam splitter 48 in the beam path of the incoming measuring light 44, and strikes the detection surface 61. After reflection on the second plane mirror 54, after diffraction on the measurement structure 32, the light of the second measuring beam 44b also runs in plus first diffraction order through the beam splitter 48 and interferes with the light of the first measuring beam 44a on the detection surface 31.

Figure 2:
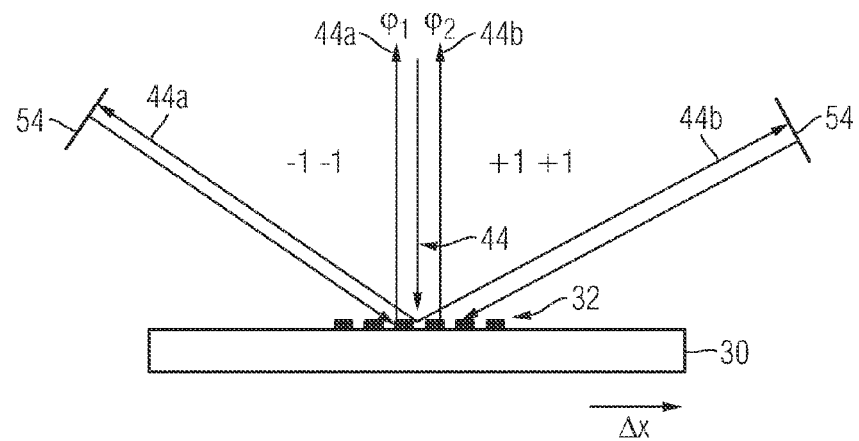
FIG. 2 mirror elements of the measuring apparatus according to FIG. 1 and the wafer to be measured in a sectional view.

The image on the detection surface 61 is a coherent superposition of the images over the two mirrors 54 and thus forms an interferogram. The interferogram contains information on the relative phase of the two paths of the measuring beams 44a and 44b, and so the position of the measurement structure 32. With reference to FIG. 2, the phase of the light of the first measuring beam 44a on the detection surface 61 is identified by $\phi_1$, and the phase of the light of the second measuring beam 44b on the detection surface 61 by $\phi_2$. With a shift of the measurement structure 32 by $\Delta x$, the following phase difference is produced:

$$\Delta\phi = \phi_1 - \phi_2 = 4 \cdot 2\pi \cdot \Delta x / p \qquad (1)$$

p being the grating period of the measurement structure 32. With a shift of the measurement structure 32 by a period p, there thus follows a peak phase deviation $\Delta\phi$ of four times the wavelength of the measuring light 44. The phase difference $\Delta\phi$ can be read out from the interferogram generated by the coherent superposition of the images over the two mirrors 54, and from this a deviation of the position of the respective measurement structure 32 in the direction of the x coordinate from its desired position can be determined.

Figure 3:
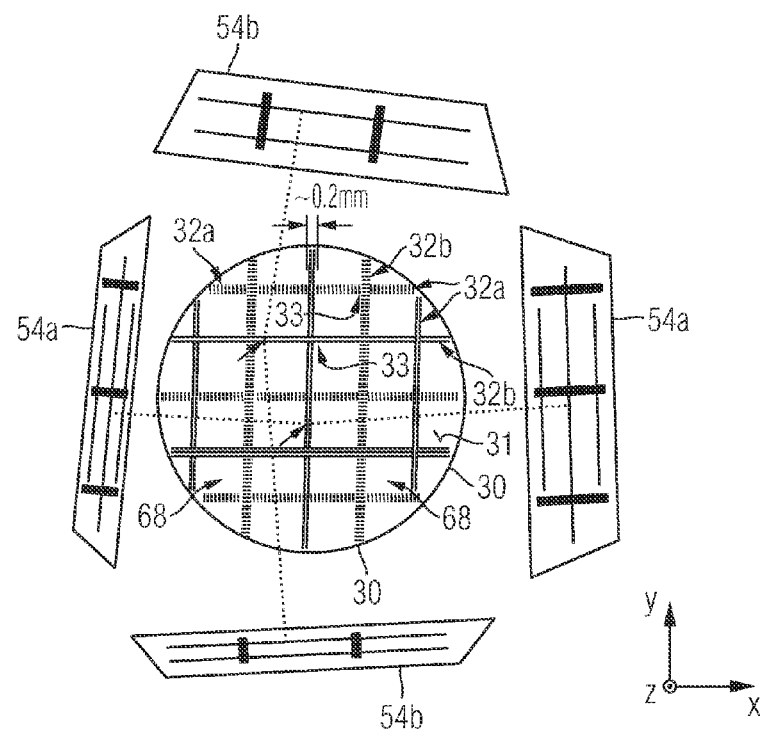
FIG. 3 a top view of the arrangement according to FIG. 2.

FIG. 3 shows the arrangement of the wafer 30 and of the plane mirrors 54 according to FIG. 1 in a top view. The mirrors identified in FIG. 1 by the reference number 54 correspond in the designation according to FIG. 3 to the mirrors 54a. These mirrors are used for the lateral position determination of measurement structures with respect to the x coordinate. For this purpose the line gratings 32a, the grating lines of which run in the y direction, are used as measurement structures. For the measurement of the whole surface of the wafer 30 the line gratings 32a are positioned in a web-type arrangement on the wafer surface 31. In order to measure the position of measurement structures in the y direction, corresponding grating structures 32b are arranged over the wafer surface 31, the grating lines of which extend in the x direction.

The grating structures 32b diffract the incident measuring light 44 onto the mirrors 54b which are disposed at an angle above in the +/−y direction in relation to the wafer 30. At the intersection points 33 of the diffraction structures 32a and 32b the position in both coordinate directions x and y can be determined. Overall, the line gratings 32a and 32b form a web structure on the wafer surface 31, the respective surface regions within the web meshes being provided as exposure fields 68 onto which the mask 20 is respectively imaged. The exposure fields 68 are often called "dies". According to one embodiment the plane mirrors 54a and 54b have a lateral expansion of at least 300 mm and a vertical expansion of at least 50 mm.

In the embodiment shown in FIG. 1, as already mentioned above, the measuring light 42, which is used for the form measurement, and the measuring light 44, which is used for the positioning measurement, have different wavelengths. Thus, for example, the wavelength $\lambda_1$ of the measuring light 44 can be between 532 nm and 633 nm, and the wavelength $\lambda_2$ of the measuring light 42 can be between 700 nm and 1064 nm. The Fizeau collimator 50 and the ocular in the form of the collimator lens 58 should be colour-corrected. Similar wavelengths for the two measurements facilitate the colour correction. For simultaneous execution of the form measurement and the positioning measurement the measurements are taken wavelength-selectively. This can take place e.g. by the locally resolving detector 40 measuring the intensity distributions generated on the detection surface 61 wavelength-selectively. Alternatively, a colour beam splitter can also be provided in the detection module of the measuring apparatus 40, as explained below with reference to FIG. 4.

Instead of different wavelengths, different polarisation can also be used for the different measurements. In an alternative embodiment measuring light of the same wavelength is used for the form measurement and the positioning measurement, and the two measuring processes are carried out one after the other.

After taking the form and positioning measurements the measurements determined are stored in a recording device 64 shown in FIG. 1. The wafer 30 is then shifted to under the projection objective 18. For this purpose, depending on the embodiment, reloading of the wafer 30 from the measuring table 38 onto the exposure table 32 is performed, or however the wafer 30 remains on the exposure table 32 which moves to under the projection objective 18. With the now following exposure of the wafer 30 both the form and the positioning measurements are communicated by the recording device 64 to a control device 66. The control device 66 controls on the one hand the focus position (z) of the exposure radiation 15 by the form measurements, and on the other hand the x,y position by the positioning measurements and optionally the imaging scale during the exposure of the wafer 30. In order to control the imaging scale during the exposure, the latter is adapted dynamically to the local measured distortion of the measurement structures 32.

The measuring apparatus 40 makes available measured data by which a high-frequency distortion on the wafer surface can be corrected. High-frequency distortion is understood to mean distortion which has a higher frequency than conventional scale errors. Conventional scale errors are proportional to the first power of the coordinate along the scanner slot. Thus, via the measured data provided by the measuring apparatus 40, distortions which are proportional to the third or higher power of the coordinate along the scanner slot can be corrected.

Figure 4:
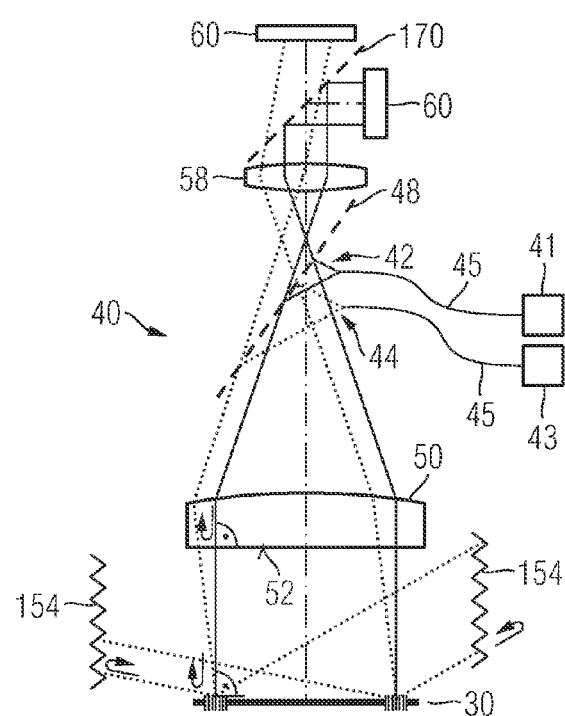
FIG. 4 a further embodiment of the measuring apparatus according to the disclosure for use in the projection exposure tool according to FIG. 1.

FIG. 4 shows a further embodiment of the measuring apparatus 40 according to the disclosure. The latter differs from the measuring apparatus 40 according to FIG. 1 in two respects. The first respect is that instead of plane mirrors, cats' eye mirror arrays 154 are used to reflect the diffracted measuring light 44. A cats' eye mirror reflects an incoming planar wave precisely back into itself. The adjustment of the cats' eye mirror is non-critical here. The use of a cats' eye mirror array 154 makes it possible to achieve reflection passing back into itself for any grating periods on the wafer 30 without having to readjust the reflectors.

The second respect in the embodiment according to FIG. 4 differing from the embodiment according to FIG. 1 is the use of a colour beam splitter 170 in the beam path of the measuring radiation 42 and 44 after the collimator lens 58. The colour beam splitter 170 is configured so that the measuring light 44 with the wavelength $\lambda_1$ passes through the beam splitter, whereas the measuring light 42 with the wavelength $\lambda_2$ is reflected on the latter. It is thus possible to separate the measuring light portions of the form measurement and the positioning measurement. A particular detector 60 is provided for each of the measured light portions. According to this embodiment the form measurement and the positioning measurement can be taken simultaneously using wavelength non-selective detectors.

Figure 5:
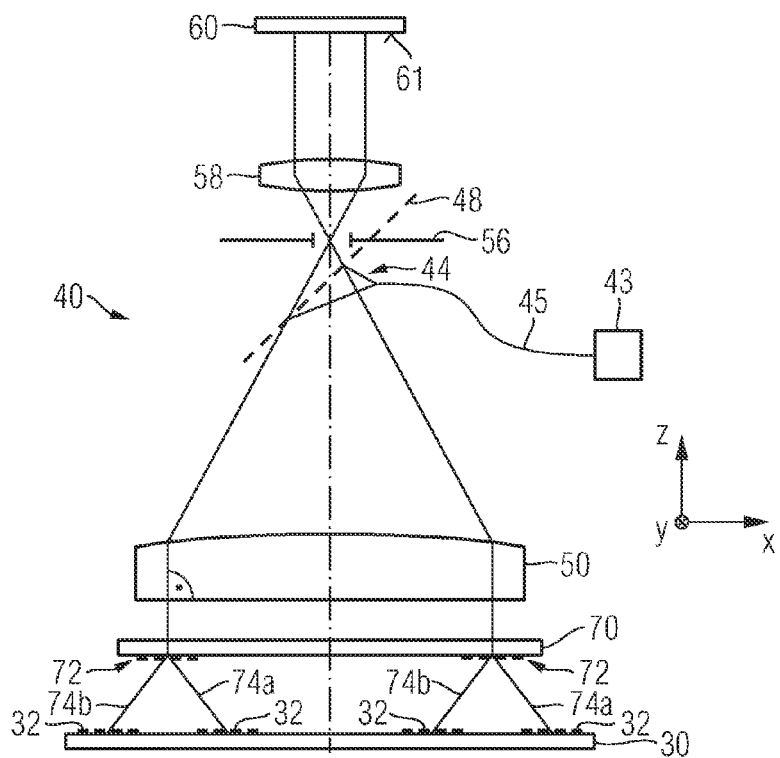
FIG. 5 a sectional view of a further embodiment of the measuring apparatus according to the disclosure for use in the projection exposure tool according to FIG. 1.

FIG. 5 shows a further embodiment 40 of a measuring apparatus according to the disclosure for use in the projection exposure tool 10 according to FIG. 1. In the embodiment shown the latter is only configured for the positioning measurement and the distortion measurement. The measuring apparatus 40 according to FIG. 5 differs from the measuring apparatus 40 according to FIG. 1 not only in that it has no measuring beam path for the topography measurement, but also in that it has no plane mirror 54. In fact, in the measuring apparatus 40 according to FIG. 5 there is disposed between the Fizeau collimator 50 and the wafer 30 a diffractive optical element 70.

Figure 6:
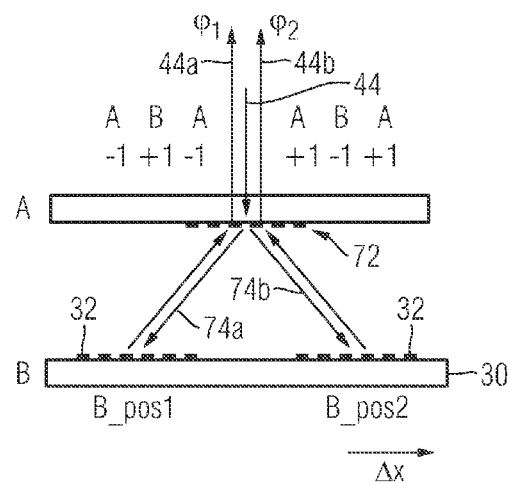
FIG. 6 an illustration of the functional principle of the measuring apparatus according to FIG. 5.

The diffractive optical element 70 includes grating structures 72 for the respective splitting of the incoming measuring light 44 into two measuring beams 74a and 74b. FIG. 6 shows the beam path for a grating structure 72 in detail. FIG. 6 shows the arrangement of the diffractive optical element 70 and of the wafer 30 in detail. The grating structure 72 is identified here by the letter "A". The splitting of the incoming measuring light 44 into the measuring beams 74a and 74b is executed by diffraction on the grating A in minus first and plus first diffraction order. The measuring beams 74a and 74b are then reflected back into themselves on the measurement structures 32 on the surface of the wafer 30 by diffraction in plus first and minus first diffraction order. The grating structure 72 is advantageously designed with a diameter of at least 300 mm in order to be able to measure the whole surface of the wafer 30.

The measurement structures 32 are also designed as grating structures, and in FIG. 6 are identified as gratings "B", the grating 32 reflecting the measuring beam 74a being located at a position 1, and the grating 32 reflecting the measuring beam 74b being located at a position 2, and this is why the corresponding gratings are identified as "B_pos1" and "B_pos2". The measuring beams 74a and 74b reflected back are diffracted on the grating structure 72 as they pass through in minus first and plus first diffraction order, and are thus guided back into the beam path of the incoming measuring light 44. The images generated by the two measuring beams 74a and 74b are superimposed coherently on the detection surface 61 in analogy to the situation in the measuring apparatus 40 according to FIG. 1. With a shift of the wafer 30 in the x direction by the amount Δx the following phase difference is produced:

$$\Delta\phi = \phi_1 - \phi_2 = 4\pi \cdot \Delta x/p \quad (2)$$

p indicating the grating period of the measurement structures 32. In comparison to the phase difference generated with the arrangement according to FIG. 2, according to FIG. 6, with the same shift Δx, only half the phase difference is produced.

Figure 7:
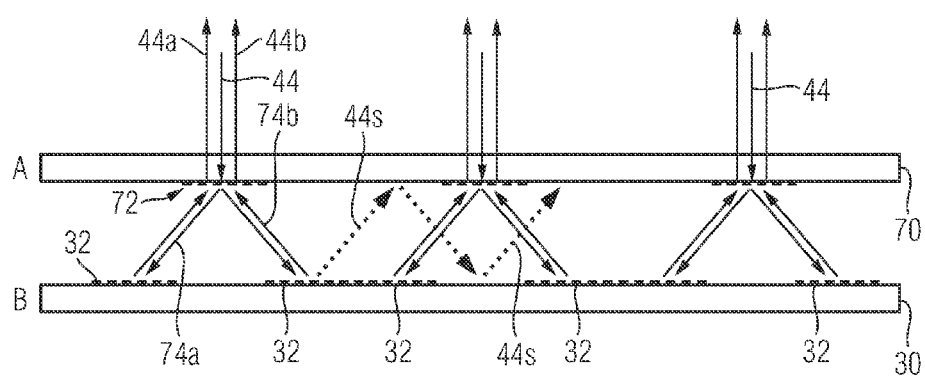
FIG. 7 an illustration of light paths between a diffractive optical element of the measuring apparatus according to FIG. 5 and the wafer to be measured.

The position calculated from the measured phase difference corresponds to the centre of gravity shift of the positions of the gratings B_pos1 and B_pos2. FIG. 7 shows the diffractive optical element 70 and the wafer 30 according to FIG. 5 for a number of measuring channels which are respectively formed by a grating structure 72 and the two associated measurement structures 32. With the arrangement of the grating structures 72 on the diffractive optical element it is important to ensure that no interfering light 44s which is produced, for example, by reflection of the measuring light 74a or 74b due to diffraction on the measurement structures 32, reaches the detector 60. The grating structures 72 are therefore disposed on the wafer 30 such that the interfering light 44s does not strike the grating structures 72 of the diffractive optical element 70, but in fact is reflected on the regions of the element 70 between the grating structures 72. Therefore, the interfering light can not be injected into another measuring channel which would falsify the measurement.

Furthermore, it is possible to arrange different gratings on the diffractive optical element 70 acting as a beam splitter. Correspondingly adapted gratings should be assigned to the latter on the wafer 30. Furthermore, special gratings can be provided on the diffractive optical element 70 which detect the position of the measuring table 38. Such gratings are adapted to grating structures on the measuring table 38.

Figure 8:
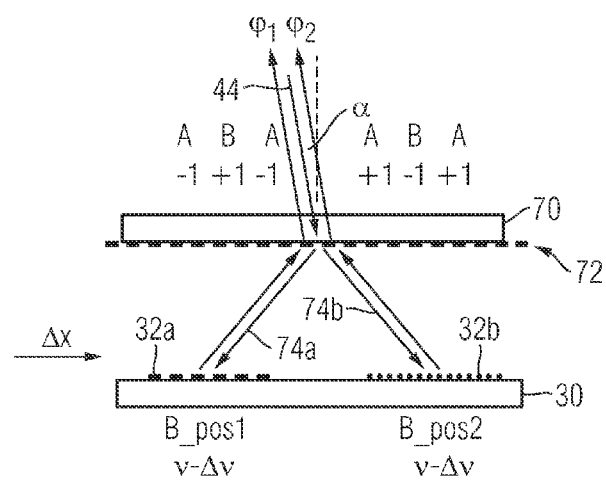
FIG. 8 an illustration of a variant according to the disclosure of the measuring apparatus according to FIG. 5.

FIG. 8 illustrates a further embodiment of a measuring apparatus 40 for use in the projection exposure tool 10 according to FIG. 1. This embodiment only differs from the embodiment according to FIG. 5 in that the measuring radiation 44 is not irradiated perpendicularly, but at an angle $\alpha$ in relation to the normal onto the diffractive optical element 70. The measuring beams 74a and 74b generated in minus or plus first diffraction order then strike the wafer surface at different angles. In order to guarantee the corresponding back-reflection of the measuring beams, the measurement structures 32 on the wafer 30 have different periods, the B_pos1 grating the period $v-\Delta v$ and the grating at B_pos2 the period $v+\Delta v$, where:

$$v = 2 \cdot v_{gratingA} \text{ and } \Delta v = 2 \cdot 1/\lambda \cdot \sin(\alpha), \tag{3}$$

$V_{gratingA}$ designating the period of the grating structure 72. According to one embodiment the angle $\alpha$ is at least 0.1°.

Via the asymmetrical beam path in the arrangement according to FIG. 8 interfering light 44s can be prevented from being injected into an adjacent measuring channel independently of the arrangement of the grating structures 72 on the diffractive optical element 70. The measurement structures 32 can thus be disposed at any locations on the wafer surface 31. The grating structure 72 can also be designed throughout. With the embodiment according to FIG. 8 the size and position of the exposure fields 68 and "dies" are chosen arbitrarily from the viewpoint of the positioning measurement.

Figure 9:
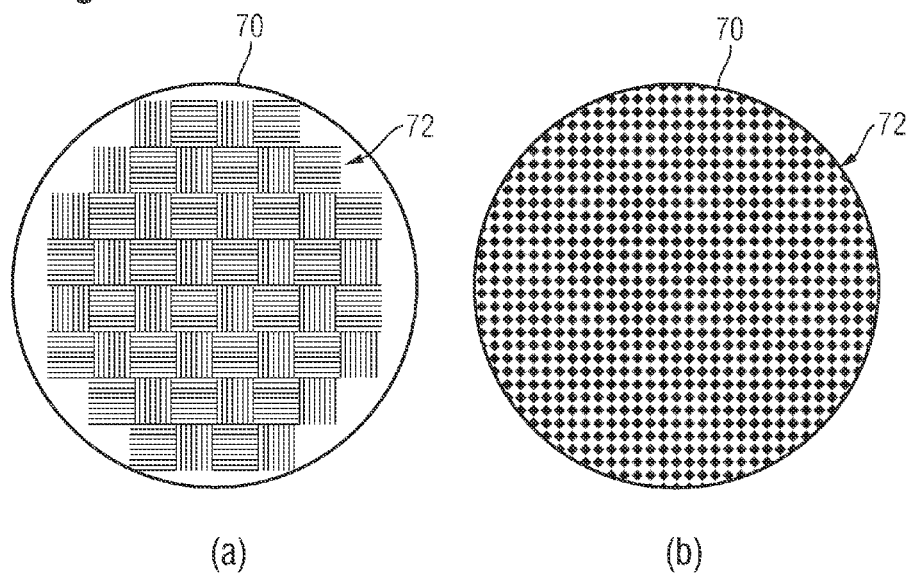
FIG. 9 a top view onto two different embodiments according to the disclosure of a diffraction pattern arrangement on a diffractive element of the measuring apparatus according to FIG. 5.

Under (a) and (b) FIG. 9 shows two different variants for a throughout arrangement, also referred to as full surface or all-over arrangement, of the grating structure 72 on the diffractive optical element 70. In the variant (a) the grating structure 72 consists of a chessboard-type arrangement with grating sections aligned alternately in the x and y directions. Centre of gravity coordinates of the respectively irradiated grating pairs B_pos1 and B_pos2 can thus be measured on the wafer 30 with respect to the x or the y coordinate. The grating alignment of the grating pairs B_pos1 and B_pos2 defines whether x or y components are measured. In the (b) variant the grating structure 72 is in the form of a two-dimensional rhomboid grating with which a position measurement with respect to the x or the y component can also be taken.

Figure 10:
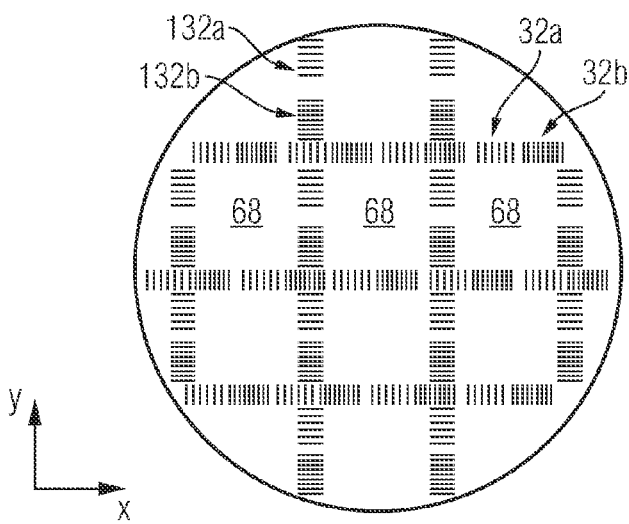
FIG. 10 a top view onto a measuring structure arrangement on a wafer surface to be measured by the measuring apparatus according to FIG. 5.

FIG. 10 shows a possible arrangement of the measurement structures 32 on the wafer 30 for use in the embodiment according to FIG. 8. Here the measurement structures B_pos1 and B_pos2 for measuring the x coordinate of the respective centre of gravity are designated by 32a and 32b. The grating structures for measuring the respective centre of gravity coordinate in the y direction are designated by 132a and 132b. As can be taken from FIG. 10, the grating structures 32a and 32b are positioned in horizontal strips in an alternating arrangement, whereas the grating structures 132a and 132b are arranged in vertical strips so that overall a web structure is produced the meshes of which surround the exposure fields 68.

Figure 11:
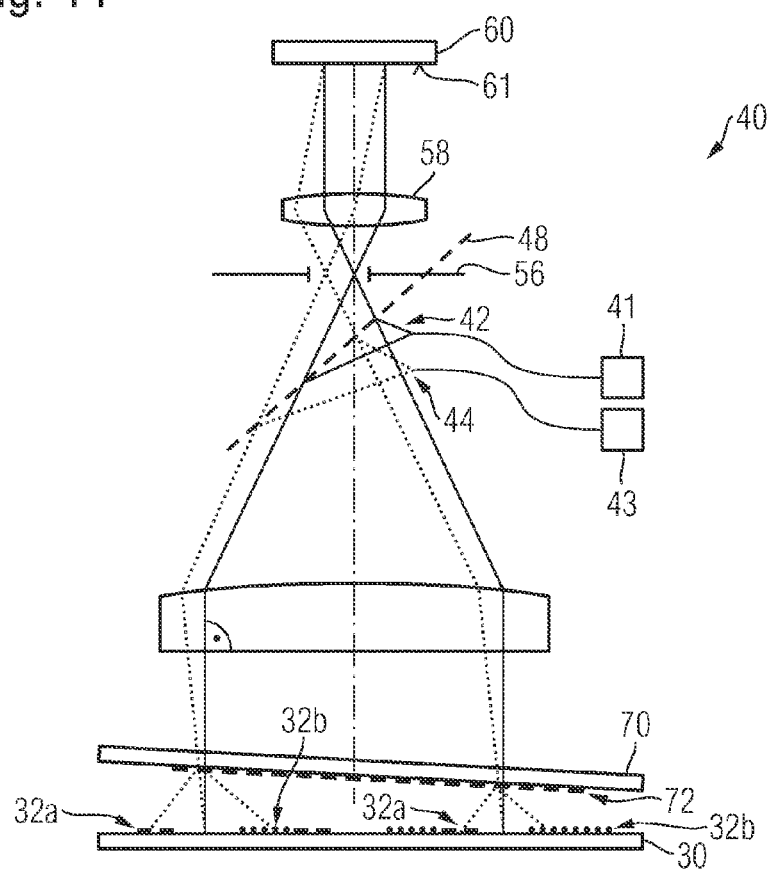
FIG. 11 a sectional view of a further embodiment of the measuring apparatus according to the disclosure for use in the projection exposure tool according to FIG. 1.

FIG. 11 shows a further embodiment of the measuring apparatus 40 for use in the projection exposure tool 10 according to FIG. 1. Like the embodiment according to FIG. 5, this embodiment includes a diffractive optical element 70. The diffractive optical element 70 according to FIG. 11 is, however, tilted in relation to the wafer 30. This makes it possible to simultaneously perform a form measurement by using the measuring light 42 of a measuring light source 41 already known from FIG. 1. The tilting of the diffractive optical element 70 leads to the measuring light 42 not striking the diffractive optical element 70 perpendicularly, and so no interfering back reflexes reach the detector 60 through the aperture 56. The period of the grating structure 72 is chosen such that the wavelength $\lambda 2$ of the measuring light 42 passes through the grating structure 72 without being diffracted, while the wavelength $\lambda 1$ of the measuring light 44 is diffracted in minus and plus first diffraction order.

Figure 12:
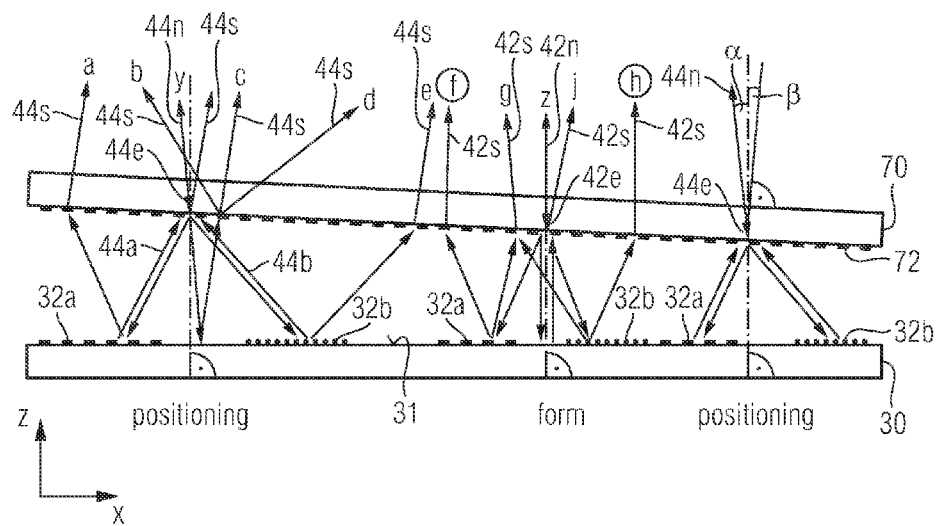
FIG. 12 an illustration of light paths between a diffractive optical element of the measuring apparatus according to FIG. 11 and the wafer to be measured.

FIG. 12 shows the light paths both for the measuring light 44 for the distortion and positioning measurement and the measuring light 42 for the form and topography measurement in the region of the diffractive optical element 70 and the wafer 30 according to FIG. 11. Here, in FIG. 12 beams for the positioning and the form measurement are drawn in next to one another. However, the measuring method enables all-over measurement of the form at all positions and simultaneously to this a measurement of the positioning for all of the positioning gratings provided. A spatial separation into regions for positioning or form is not necessary. The incoming measuring light is identified by 44e and 42e. Furthermore, in the figure thick lines show the used light paths which for the positioning measurement include the incoming measuring light 44e, the measuring beams 44a and 44b and the returning used light beam 44n. For the form measurement the used light path includes the incoming measuring light 42e which passes through the diffractive optical element 70 without directional diversion, and after reflection on the wafer surface 31 the beam 42n returning to the interferometer.

Furthermore, in FIG. 12 interfering light paths are drawn in with thin lines. Interfering light paths are produced by diffraction of the used light on one of the gratings 72, 32a and 32b. In FIG. 12 a few interfering light paths are drawn in which are produced in zero, minus first and plus first diffraction order on one of the gratings 72, 32a and 32b. An interfering light path is thus produced, for example, when the incoming measuring light 44e in the zero diffraction order passes through the grating 72, reflects on the wafer surface 31 and subsequently passes through the grating structure 72 in zero, plus first or minus first diffraction order. The resulting interfering light beams are identified by b, c and d in FIG. 12.

A further example of interfering light in the positioning channel relates to light of the measuring beam 44a which upon reflection on the grating 32a is not reflected back in minus first diffraction order, but passes in zero diffraction order to the diffractive optical element 70 and is then diffracted on the grating 72 in plus first diffraction order and passes back into the optics of the measuring apparatus 40. The resulting interfering light is identified by a. In a similar way interfering light paths can be produced in the form channel, for example when the incoming measuring light 42e is diffracted on the grating 72 in a diffraction order different from zero, and then falls on one of the diffraction gratings 32a and 32b.

As already mentioned above, the diffractive optical element 70 is tilted in relation to the wafer 30 at the angle β drawn in FIG. 12. Furthermore, the angle of incidence of the incoming measuring light 44e for the positioning measurement in relation to the normal to the wafer surface 31 is tilted by the angle α. The dimensioning of the tilt angles α and β is executed such that as little interfering light as possible passes to the detector 60. By choosing the angles α and β cleverly the interfering light can be blocked out at least to a predominant extent by the aperture 56.

Tab. 1 below includes a list of all of the light beams which can be produced during the positioning measurement taking into account the minus first, zeroth and plus first diffraction order on the gratings 72, 32a and 32b. In order to indicate the direction of the individual light beams the respective x component of the corresponding direction vector is specified in Tab. 1. For the direction of incidence of the measuring light 44e an x component of 5 is applied. The individual columns identify first of all the diffraction order of the incoming measuring light 44e on the diffractive optical element 70, the second column the diffraction order on the grating structure 32a on the wafer 30, the third column the diffraction order on the grating structure 72 on the return path of the light into the optics of the measuring apparatus 40. In the fourth column the x component of the direction vector of the corresponding light beam after passing through the diffractive optical element 70 for the second time is specified.

TABLE 1

Positioning DIFFRACTION ORDERS

| direction of incidence x component of the k-vector 5 | DOE outward path 500 | Wafer 1010 | DOE return path ### | emergent direction x component of the k-vector | direction of incidence 5 | DOE outward path 500 | Wafer 990 | DOE return path 500 | emergent direction x component of the k-vector |
|---|---|---|---|---|---|---|---|---|---|
| | -1 | -1 | -1 | -2005 | | -1 | -1 | -1 | -1985 |
| | -1 | -1 | 0 | -1505 | | -1 | -1 | 0 | -1485 |
| | -1 | -1 | 1 | -1005 | | -1 | -1 | 1 | -985 |
| | -1 | 0 | -1 | -995 | | -1 | 0 | -1 | -995 |
| | -1 | 0 | 0 | -495 | | -1 | 0 | 0 | -495 |
| | -1 | 0 | 1 | 5 | | -1 | 0 | 1 | 5 a |
| | -1 | 1 | -1 | 15 | | -1 | 1 | -1 | -5 y used reflex |
| | -1 | 1 | 0 | 515 | | -1 | 1 | 0 | 495 |
| | -1 | 1 | 1 | 1015 | | -1 | 1 | 1 | 995 |
| | 0 | -1 | -1 | -1505 | | 0 | -1 | -1 | -1485 |
| | 0 | -1 | 0 | -1005 | | 0 | -1 | 0 | -985 |
| | 0 | -1 | 1 | -505 | | 0 | -1 | 1 | -485 |
| | 0 | 0 | -1 | -495 b | | 0 | 0 | -1 | -495 b |
| | 0 | 0 | 0 | 5 c | | 0 | 0 | 0 | 5 c |
| | 0 | 0 | 1 | 505 d | | 0 | 0 | 1 | 505 d |
| | 0 | 1 | -1 | 515 | | 0 | 1 | -1 | 495 |
| | 0 | 1 | 0 | 1015 | | 0 | 1 | 0 | 995 |
| | 0 | 1 | 1 | 1515 | | 0 | 1 | 1 | 1495 |
| | 1 | -1 | -1 | -1005 | | 1 | -1 | -1 | -985 |
| | 1 | -1 | 0 | -505 | | 1 | -1 | 0 | -485 |
| | 1 | -1 | 1 | 5 y used reflex | | 1 | -1 | 1 | 15 |
| | 1 | 0 | -1 | 5 e | | 1 | 0 | -1 | 5 |
| | 1 | 0 | 0 | 505 | | 1 | 0 | 0 | 505 |
| | 1 | 0 | 1 | 1005 | | 1 | 0 | 1 | 1005 |
| | 1 | 1 | -1 | 1015 | | 1 | 1 | -1 | 995 |
| | 1 | 1 | 0 | 1515 | | 1 | 1 | 0 | 1495 |
| | 1 | 1 | 1 | 2015 | | 1 | 1 | 1 | 1995 |

Columns five to eight positioned on the right-hand side of Tab. 1 give the analogue information for the case in which a corresponding light path leads over the grating structure 32b onto the wafer 30. According to Tab. 1, for the grating 72 the value 500, for the grating 32a the value 1010, and for the grating 32b the value 990 are applied as grating periods. The values indicate the stripe density of the gratings in any units and correspond to the change in the x component of the propagation direction of the light wave with diffraction in 1$^{st}$ order. Lines per millimeter, for example, can be chosen as the unit. The beams a, b, c, d, e and y drawn in FIG. 12 are identified in Table 1. As can be seen from the table, none of the interfering light vectors has the direction of the used light 44n which is identified by "y".

Tab. 2 shows the information similar to Tab. 1 for the form measuring channel. Here the x component of the incoming measuring light 42e is zero. It can be gathered from the table that two reflexes of the interfering light 42s, namely the interfering reflexes f and h have the propagation direction of the used reflex z. All other interfering light beams 42s point in directions different from the used reflex z. In the following measures which are used to also suppress the remaining interfering reflexes h and f are described.

TABLE 2

Form DIFFRACTION ORDERS

| direction of incidence x component of the k-vector 0 | DOE outward path 500 | Wafer 1010 | DOE return path ### | emergent direction x component of the k-vector | direction of incidence 0 | DOE outward path 500 | Wafer 990 | DOE return path 500 | emergent direction x component of the k-vector |
|---|---|---|---|---|---|---|---|---|---|
| -1 | -1 | -1 | -1 | -2010 | | -1 | -1 | -1 | -1990 |
| -1 | -1 | -1 | 0 | -1510 | | -1 | -1 | 0 | -1490 |
| -1 | -1 | -1 | 1 | -1010 | | -1 | -1 | 0 | -990 |
| -1 | -1 | 0 | -1 | -1000 | | -1 | 0 | -1 | -1000 |
| -1 | -1 | 0 | 0 | -500 | | -1 | 0 | 0 | -500 |
| -1 | -1 | 0 | 1 | 0 interfering reflex | | -1 | 0 | 1 | 0 f interfering reflex |
| -1 | -1 | 1 | -1 | 10 | | -1 | 1 | -1 | -10 |
| -1 | -1 | 1 | 0 | 510 | | -1 | 1 | 0 | 490 |
| -1 | -1 | 1 | 1 | 1010 | | -1 | 1 | 1 | 990 |
| 0 | -1 | -1 | -1 | -1510 | | 0 | -1 | -1 | -1490 |
| 0 | -1 | -1 | 0 | -1010 | | 0 | -1 | 0 | -990 |
| 0 | -1 | -1 | 1 | -510 | | 0 | -1 | 1 | -490 |
| 0 | -1 | 0 | -1 | -500 | | 0 | 0 | -1 | -500 |
| 0 | 0 | 0 | 0 | 0 z used reflex | | 0 | 0 | 0 | 0 z used reflex |
| 0 | 0 | 0 | 1 | 500 | | 0 | 0 | 1 | 500 |
| 0 | 0 | 1 | -1 | 510 | | 0 | 1 | -1 | 490 |
| 0 | 0 | 1 | 0 | 1010 | | 0 | 1 | 0 | 990 |
| 0 | 0 | 1 | 1 | 1510 | | 0 | 1 | 1 | 1490 |
| 1 | 1 | -1 | -1 | -1010 | | 1 | -1 | -1 | -990 |
| 1 | 1 | -1 | 0 | -510 | | 1 | -1 | 0 | -490 |
| 1 | 1 | -1 | 1 | -10 | | 1 | -1 | 1 | 10 |
| 1 | 1 | 0 | -1 | 0 interfering reflex | | 1 | 0 | -1 | 0 interfering reflex |
| 1 | 1 | 0 | 0 | 500 | | 1 | 0 | 0 | 500 |
| 1 | 1 | 0 | 1 | 1000 | | 1 | 0 | 1 | 1000 |
| 1 | 1 | 1 | -1 | 1010 | | 1 | 1 | -1 | 990 |
| 1 | 1 | 1 | 0 | 1510 | | 1 | 1 | 0 | 1490 |
| 1 | 1 | 1 | 1 | 2010 | | 1 | 1 | 1 | 1990 |

The dimensioning of the angles α and β can be executed according to the following list of criteria. Since the interfering light beams a, c and e return to the optics of the measuring apparatus 40 at the angle α, the angle β is greater than the numerical aperture NA of the imaging of the wafer 30 onto the detector 60:

$$\sin(\alpha) > NA \quad (4)$$

For the lateral resolution of the imaging wafer 30 to detector 60 the following applies for the resolution R:

$$R = \lambda/NA \quad (5)$$

λ being the wavelength of the measuring light in question. A resolution of R=0.25 mm with λ=633 nm results in NA=0.0025. For the angle of incidence α this then gives a value of >0.14°.

Since the interfering light j has to return at the angle 2β, the following applies:

$$\sin(2\beta) > NA \quad (6)$$

For the tilt angle β this therefore gives a value of >0.07°. With a wafer with a diameter of 300 mm there is only 0.37 mm distance variation between the diffractive optical element 70 and the wafer 30. It can also be advantageous to design the angle of incidence a and the tilt angle β to be perpendicular to one another. A higher lateral resolution involves a greater angle of incidence a and a greater tilt angle β.

Figure 13:
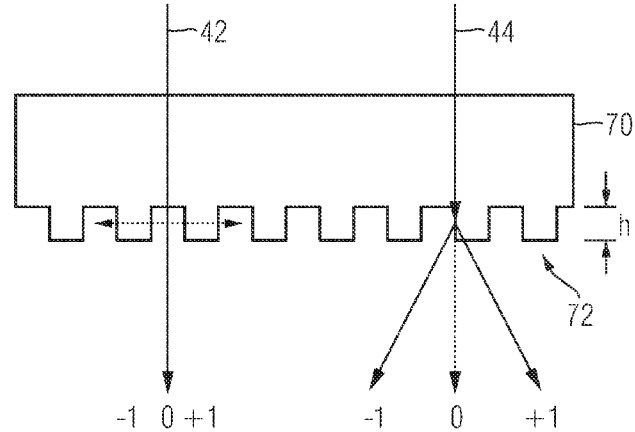
FIG. 13 an illustration of a variant according to the disclosure of the diffractive optical element for use in the measuring apparatus according to FIG. 11.
Figure 14:
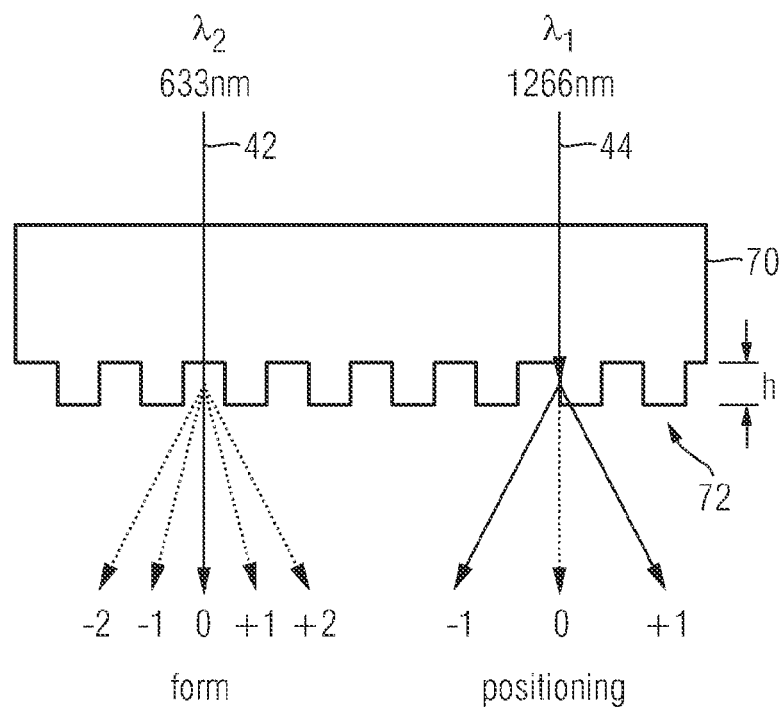
FIG. 14 an illustration of a further variant according to the disclosure of the diffractive optical element for use in the measuring apparatus according to FIG. 11.

FIGS. 13 and 14 show two different embodiments for the grating structure 72 of the diffractive optical element according to FIG. 11. In the embodiment according to FIG. 13 the grating structure 72 is called the zero order grating and is designed for the wavelength λ2 of the measuring light 42 of the form measurement. With a zero order grating all of the diffraction orders apart from the zeroth order are suppressed. The wavelength λ1 of the measuring light 44 for the positioning measurement is smaller than λ2 so that a plus/minus first diffraction order can be generated. The period p of the grating 72 is between the values of the wavelength λ2 and λ1. As specified in FIG. 13, for λ2 wavelengths of between 700 and 1064 nm, and for λ1 wavelengths of 532 to 632 nm are advantageous. It can be advantageous to use e.g. 1064 nm for λ2 with the frequency doubled wavelength of 532 nm for λ1.

The height h of the grating structure 72 has the following dimensions:

$$h = 0.5 \times \lambda 2/(n-1) = \lambda 2 \text{ for } n = 1.5. \quad (7)$$

Alternatively to the method with zero order grating one can proceed as follows.

In the embodiment of the diffractive optical element according to FIG. 14 the grating structure 72 is configured with an optimised grating profile for reducing the efficiencies of the higher diffraction orders of the measuring light 42 with the wavelength λ2 for the form measurement. However, the corresponding diffraction efficiency can not be totally reduced to zero upon the basis of the electromagnetic effects. With a grating period of less than 5λ one can expect efficiencies in the percentage range. This results in disturbances of the wavefront of only approximately 10 nm. As specified in FIG. 14, in this embodiment one can choose for λ1 for example 1266 nm and for λ2 for example 693 nm.

As a further alternative for suppressing the interferences during the form measurement using higher diffraction orders white light interferometry with an upstream cavity can be used.

The measuring apparatus 40 according to the disclosure for the form and positioning measurement was described above for the example of measuring a wafer 30. According to a further embodiment according to the disclosure the measuring apparatus 40 according to the disclosure for the form and positioning measurement is used on a reticle or the mask 20.

LIST OF REFERENCE NUMBER 10 projection exposure tool
12 illumination system
14 exposure radiation source
15 exposure radiation
16 beam propagation optics
17 illuminator
18 projection objective
19 frame
20 mask
22 mask structures
24 mask table
30 wafer
31 wafer surface
31 measurement structure
32a line grating
32b line grating
33 exposure table
34 wafer holder
36 shifting stage
38 measuring table
40 measuring apparatus
41 first measuring light source
42 first measuring light
42n used light
42s interfering light
43 second measuring light source
44 second measuring light
44a first measuring beam
44b second measuring beam
44e incoming measuring light
44n used light
44s interfering light
46 interferometer
48 beam splitter
50 Fizeau collimator
51 optical axis
52 Fizeau surface
54 plane mirror
54a plane mirror
54b plane mirror
56 aperture
58 collimator lens
60 locally resolving detector
61 detection surface
62 evaluating device
64 recording device
66 control device
68 exposure field
70 diffractive optical element
72 grating structure
74a, 74b measuring beam
132a grating structure
132b grating structure
154 cats' eye arrangement
170 colour beam splitter

What is claimed is:

1. A tool, comprising:
a measuring apparatus configured to determine a relative position of measurement structures relative to each other in a lateral direction,
wherein:
the tool is a microlithography projection exposure tool configured to image mask structures of a first substrate onto a second substrate which is different from the first substrate;
the measurement structures are disposed on a surface of the first substrate, or the measurement structures are disposed on a surface of the second substrate; and
the measuring apparatus is configured so that, during use of the measuring apparatus, the measuring apparatus determines, via simultaneous interferometric measurement, relative lateral positions of at least three measurement structures which are laterally offset relative to each other.

2. The tool of claim 1, wherein the measuring apparatus is configured to simultaneously measure the lateral relative position of measurement structures distributed over the whole substrate surface comprising the measurement structures.

3. The tool of claim 1, wherein the measuring structures are on the surface of the second substrate.

4. The tool of claim 1, wherein the measuring apparatus comprises at least two reflective elements configured to reflect back onto the measurement structures measuring light divided into two measuring beams by diffraction on the measurement structures.

5. The tool of claim 1, wherein the measuring apparatus comprises a beam splitter for splitting measuring light into two measuring beams with different propagation directions before striking the substrate to be measured.

6. The tool of claim 5, wherein the beam splitter comprises a diffraction grating.

7. The tool of claim 5, wherein the measuring apparatus is configured to irradiate the measuring light at an angle to the substrate surface to be measured onto the beam splitter.

8. The tool of claim 5, wherein the measuring apparatus is configured to superimpose coherently images of the measurement structures generated via the two measuring beams.

9. The tool of claim 1, wherein the measuring apparatus is configured to determine distortion over the substrate surface from the lateral position measurements, and the projection exposure tool further comprises an exposure control device which is configured to adapt a local imaging scale dynamically to the distortion when exposing the substrate.

10. The tool of claim 1, wherein the measuring apparatus is configured to take topography measurements at a number of points of the substrate surface simultaneously.

11. The tool of claim 1, wherein the measuring apparatus is configured to take the lateral position measurements with measuring light of a first wavelength, and the topography measurements with measuring light of a second wavelength.

12. The tool of claim 11, wherein the measuring apparatus comprises a diffraction grating configured to split the measuring light of the first wavelength into two measuring beams, and the diffraction grating being configured so that at least 90% of the measuring light of the second wavelength passes through the diffraction grating without being diffracted.

13. The tool of claim 12, wherein the diffraction grating is tilted relative to the propagation direction of the measuring light of the second wavelength.

14. The tool of claim 1, wherein the measuring apparatus is configured to take the measurement of the whole substrate surface in less than 10 seconds.

15. The tool of claim 1, wherein the measuring structures are on the surface of the second substrate, and the measuring apparatus comprises a beam splitter for splitting measuring light into two measuring beams with different propagation directions before striking the substrate to be measured.

16. The tool of claim 1, wherein the measuring structures are on the surface of the second substrate, the measuring apparatus comprises a diffraction grating configured to split the measuring light of the first wavelength into two measuring beams, and the diffraction grating being configured so that at least 90% of the measuring light of the second wavelength passes through the diffraction grating without being diffracted.

17. A method, comprising:
using interferometric measurement to simultaneously determine relative lateral positions of at least three measurement structures with respect to a substrate on which the at least three measurement structures are laterally offset relative to each other, the substrate being a first substrate or a second substrate; and
using a microlithography projection exposure tool to image mask structures on the first substrate onto the second substrate while simultaneously locally varying an imaging parameter based on the lateral position measurements.

18. The method of claim 17, comprising locally varying an imaging scale while exposing the substrate.

19. The method of claim 17, wherein the measurement structures disposed on the substrate comprise diffraction gratings of different periodicities.

20. The method of claim 17, wherein the measurement marks are on the second substrate, and an entirety of the measurement structures forms a web structure with a plurality of web meshes which surround structurable product areas with a single exposure of the first substrate.

* * * * *

UNITED STATES PATENT AND TRADEMARK OFFICE
CERTIFICATE OF CORRECTION

PATENT NO.        : 9,442,393 B2
APPLICATION NO.   : 14/524486
DATED             : September 13, 2016
INVENTOR(S)       : Hetzler et al.

It is certified that error appears in the above-identified patent and that said Letters Patent is hereby corrected as shown below:

On the Title Page

Page 2, Column 2, Line 26, item [56], delete "Larg" and insert -- Large --.

In the Specification

Column 10, Line 23, after "$\Delta\varphi = \varphi1 - \varphi2 = 4 \cdot 2\pi \cdot \Delta x / p$", insert -- , --.

Column 18, Line 44, delete "a and" and insert -- $\alpha$ and --.

Column 18, Line 46, delete "a and" and insert -- $\alpha$ and --.

Column 19, Line 42, delete "31" and insert -- 32 --.

Signed and Sealed this
Fourteenth Day of March, 2017

Michelle K. Lee
*Director of the United States Patent and Trademark Office*